United States Patent [19]

Velazquez

[11] Patent Number: 4,464,634

[45] Date of Patent: Aug. 7, 1984

[54] AUDIO POWER AMPLIFIER

[75] Inventor: Juan F. Velazquez, Saline, Mich.

[73] Assignee: VSP Labs, Inc., Ann Arbor, Mich.

[21] Appl. No.: 386,944

[22] Filed: Jun. 10, 1982

[51] Int. Cl.³ ............................................. H03F 3/30
[52] U.S. Cl. ..................................... 330/264; 330/110; 330/265
[58] Field of Search ..................... 330/264, 265, 110

[56] References Cited

U.S. PATENT DOCUMENTS

| | | | |
|---|---|---|---|
| 3,392,341 | 7/1968 | Burns | 330/277 |
| 3,822,408 | 7/1974 | Veranth | 330/110 X |
| 3,984,782 | 10/1976 | Shizuhara | 330/269 |
| 4,015,212 | 3/1977 | Miyata | 330/264 |
| 4,021,747 | 5/1977 | Todokoro | 330/264 X |
| 4,159,450 | 6/1979 | Hoover | 330/264 |
| 4,241,313 | 12/1980 | Takehara | 330/253 |
| 4,349,788 | 9/1982 | Sondermeyer | 330/110 X |

FOREIGN PATENT DOCUMENTS 2840497  3/1980  Fed. Rep. of Germany ...... 330/264

OTHER PUBLICATIONS

Konrath, "MOSFET Pairs Simplify Audio-Amplifier Design," *Electronic Design*, Aug. 2, 1980, vol. 28, No. 16, pp. 25-29.

*Primary Examiner*—James B. Mullins
*Attorney, Agent, or Firm*—Basile, Weintraub & Hanlon

[57] ABSTRACT

An audio power amplifier includes an input amplifier stage and an output power amplifier stage. The output power amplifier stage comprises a p-channel field effect transistor and an n-channel field effect transistor having interconnected drain electrodes forming an output signal terminal. A driver circuit is provided for driving the p-channel and n-channel field effect transistors in a transconductance mode of operation in which the output current through the field effect transistors is directly proportional to the input voltage applied to the output amplifier stage. A first feedback path is provided between the output power amplifier stage and the input amplifier stage. A second feedback path is formed between the output and input of the input amplifier stage.

1 Claim, 6 Drawing Figures

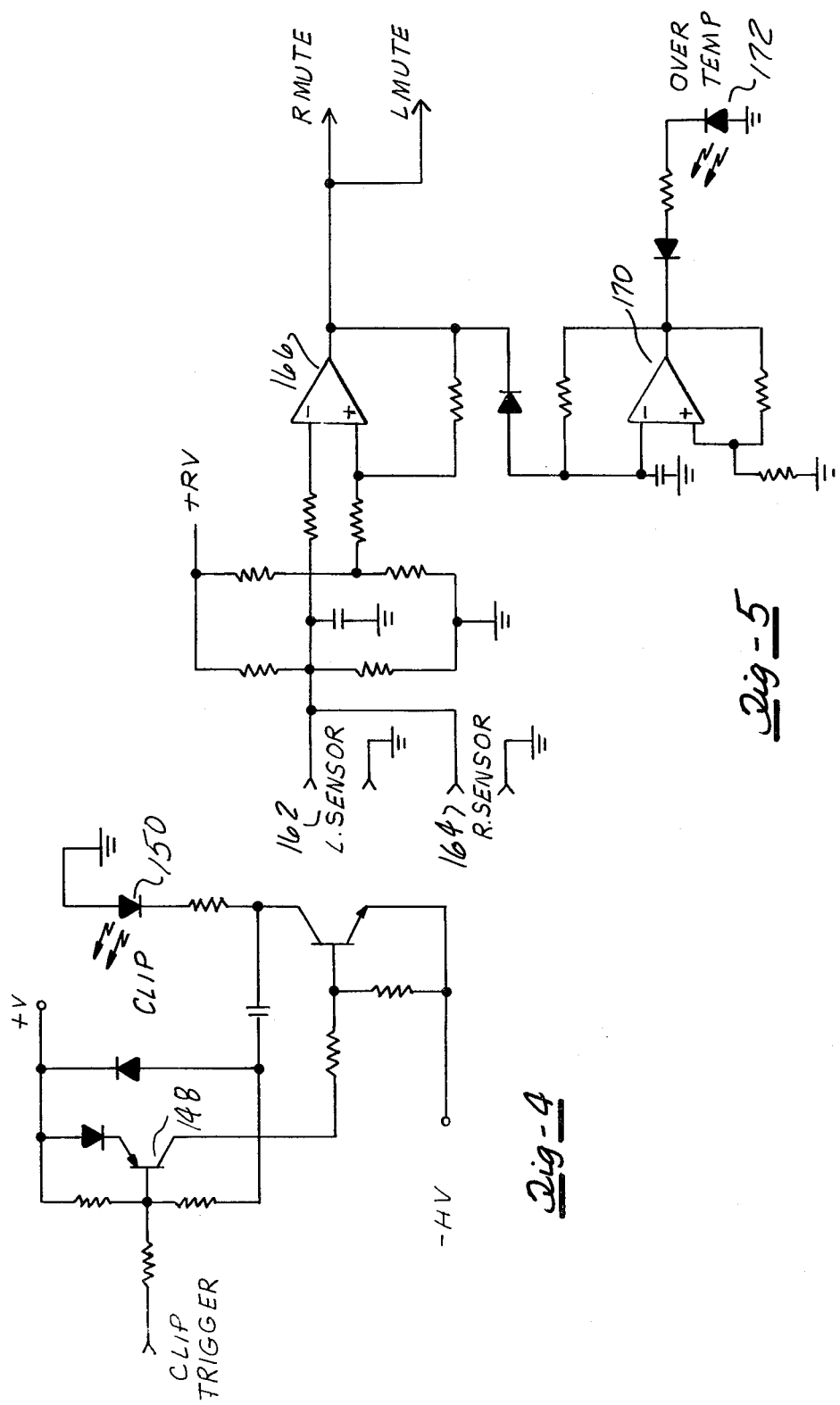

AUDIO POWER AMPLIFIER

BACKGROUND OF THE INVENTION

1. Field Of The Invention

This invention relates, in general, to amplifiers and, more specifically, to audio power amplifiers.

2. Description Of The Prior Art

Audio power amplifiers generally employ one of two different types of amplification devices, i.e., vacuum tubes or transistors. Both types have their advantages and disadvantages.

In a vacuum tube amplifier, superior audio response is attainable, however, at the expense of large size, weight and power consumption. Conventional bipolar or junction transistor based amplifiers while providing a significant reduction in the size and weight of the amplifier, have not been able to match the audio characteristics of vacuum tubes in providing a wide range of audio reproduction and amplification.

One of the primary factors in a vacuum tube amplifier's ability to accurately reproduce audio frequencies over a wide range is its ability to be connected in a transconductance mode of operation in which the output current through the output stage of the vacuum tube amplifier is a direct function of the input voltage to the amplifier. Such a circuit configuration isolates the output current from the input drive voltage and provides voltage amplification between the output and input voltages and simplicity in the construction of the input drive circuit. Such an amplifier circuit configuration is not possible utilizing bipolar type transistors.

A more recent development in the field of solid state circuitry, the field effect transistor (FET) and, more particularly, the power MOS-FET, have also been employed in audio amplifiers since they possess essentially the same operating characteristics as vacuum tubes. However, field effect transistors have, up to now, been employed in audio power amplifiers in the same circuit configurations as bipolar transistors, i.e., in an emitter-follower output connection, which effectively causes such FET-based amplifier output stages to behave as bipolar transistors with all of their limitations.

Thus, it would be desirable to provide an audio power amplifier having a transistor based output stage which matches the audio reproduction cabilities previously attainable only with vacuum tubes. It would also be desirable to provide an audio power amplifier in which power output transistors can be connected in the same output stage arrangement as vacuum tubes.

SUMMARY OF THE INVENTION

There is disclosed herein a new and improved audio power amplifier. The audio power amplifier includes an input amplifying means and an output power amplifying means. The output power amplifying means includes a p-channel field effect transistor and an n-channel field effect transistor, each having gate, source and drain electrodes. The drain electrodes of the p-channel and n-channel field effect transistors are interconnected to form an output signal terminal.

According to a preferred embodiment, a plurality of p-channel and n-channel field effect transistors are connected in parallel with field effect transistors of the complimentary type to obtain a predetermined amount of power output from the amplifier.

Means are provided for driving the p-channel and n-channel field effect transistors in a transconductance mode of operation wherein the output current through the field effect transistors is directly proportional to the input voltage applied to the output power amplifying means.

A first feedback path is provided between the interconnected drain electrodes of the field effect transistors and the input of the input amplifying means. A second feedback path is provided between the output and input of the input amplifying means and is operative to bias the input amplifying means into linear operation just prior to the return of the output power amplifying means to a linear state after an overload has occurred.

The unique audio power amplifier of the present invention provides many advantages over previously devised audio power amplifiers utilizing a transistor amplifier output stage. By connecting p-channel and n-channel field effect transistors in a transconductance mode of operation, the output stage of the audio power amplifier of the present invention is configured in the same identical manner and has the same operating characteristics as previously devised power amplifiers utilizing vacuum tubes which have commonly been connected in a transconductance mode of operation. Such an arrangement has not previously been provided in transistorized power amplifiers. This unique configuration provides the advantages of quick response and small size and weight associated with the use of solid state electronics, but with the wide range of audio reproduction capabilities previously attainable only with vacuum tube amplifiers.

The provision of a second feedback path between the output and input of the input amplifying means provides a significant reduction in the distortion that typically occurs in an amplifier when the output is overloaded during peak input signals. This feedback path forces the input amplifying means into a linear mode prior to the re-entering of the output amplifier means into a linear state which decreases the recovery time of the output amplifier means and results in less distortion in the reproduced sound.

BRIEF DESCRIPTION OF THE DRAWING

The various features, advantages and other uses of this invention will become more apparent by referring to the following drawing in which:

FIG. 4 is a circuit diagram of the clip detect circuitry; and

FIG. 5 is a circuit diagram of the temperature monitor circuitry of the present audio power amplifier.

DESCRIPTION OF THE PREFERRED EMBODIMENT

Figure 1:
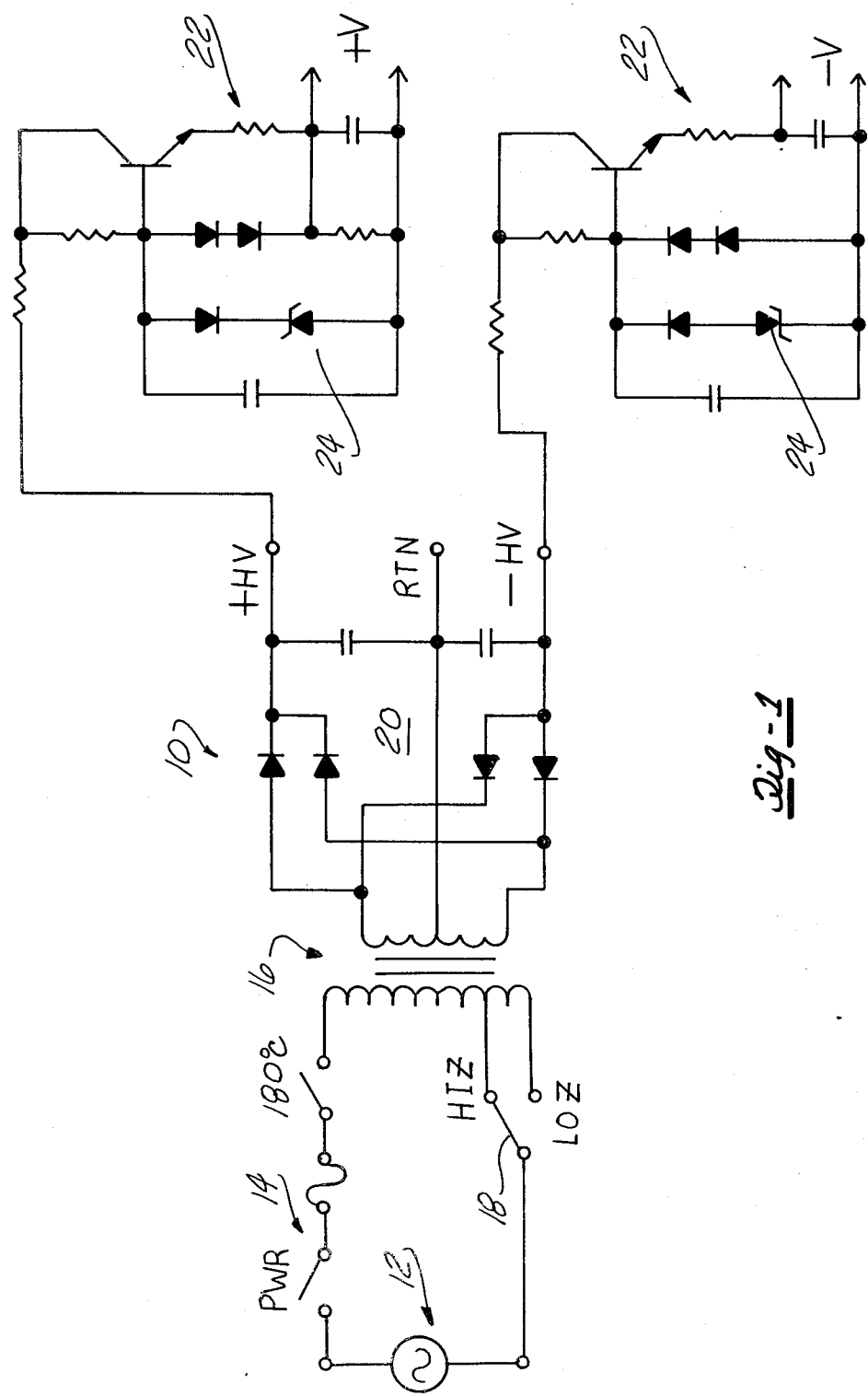
FIG. 1 is a circuit diagram of the power supply of the audio power amplifier of the present invention.

Throughout the following description and drawing, identical reference numbers are used to refer to the same component shown in multiple figures of the drawing.

Referring now to the drawing, there is illustrated an audio power amplifier operative for amplifying audio frequency signals. The audio power amplifier is adapted for connection between a source of audio frequency signals and an output load device, such as a speaker.

Referring now to FIG. 1, there is illustrated the power supply 10 for the audio amplifier of the present invention. The power supply 10 is adapted for connection to a suitable source 12 of AC power. Preferably, the source 12 provides 110 to 120 volts AC power. A power on switch 14 is provided for connecting the primary side of a transformer 16 to the source of power 12. A second switch 18 is provided at one end of the primary winding of the transformer 16 and is switchable between two positions, each connected to a different portion of the primary winding so as to enable the number of turns of the primary winding to be changed. In this manner, more efficient operation of the audio power amplifier may be provided for differing impedance loads. Preferably, the second switch 18 position labelled HIZ is selected for normal audio program material. An integral over-temperature responsive switch 19 is also provided to disconnect the transformer 16 from the source 12 when an over-temperature condition is detected.

The transformer 16 provides through a secondary winding a transformed lower level voltage which is rectified by diode bridge 20 into a DC voltage labelled ± HV.

The output from the secondary of the transformer 16, after being rectified by the diode bridge 20, is applied to two indentical high voltage regulator circuits 22. The regulator circuits 22 are designated to provide a constant regulated output voltage and incorporate a zener diode 24 therein which maintains the output voltage, labelled ±V, from each regulator 22 at a constant magnitude despite variations in the voltage input to the regulators 22. In the preferred embodiment, the zener diode 24 is selected to provide a 20 volt output.

Figure 3A:
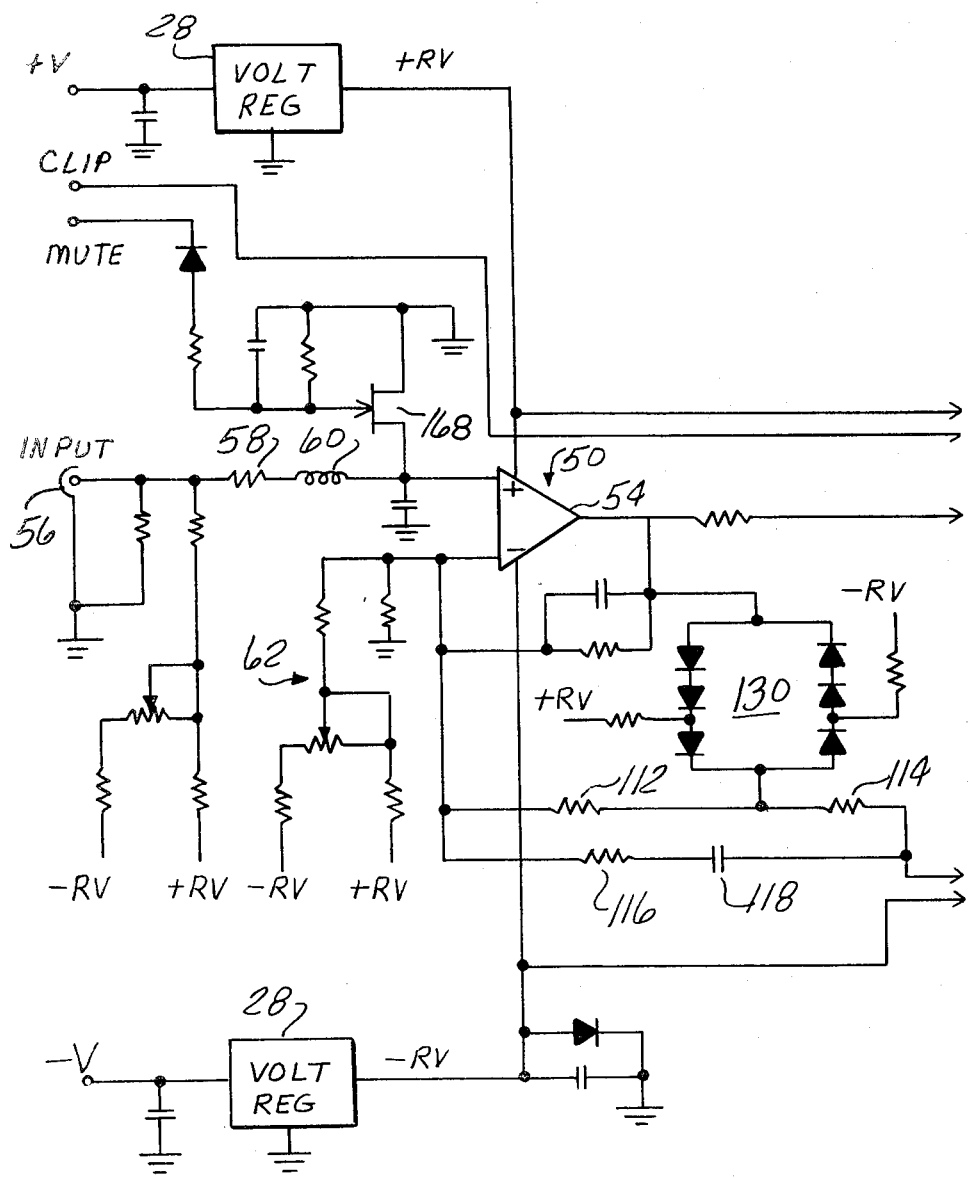
FIGS. 3a and 3b are circuit diagrams of the power amplifier circuitry of the present audio power amplifier.
Figure 3B:
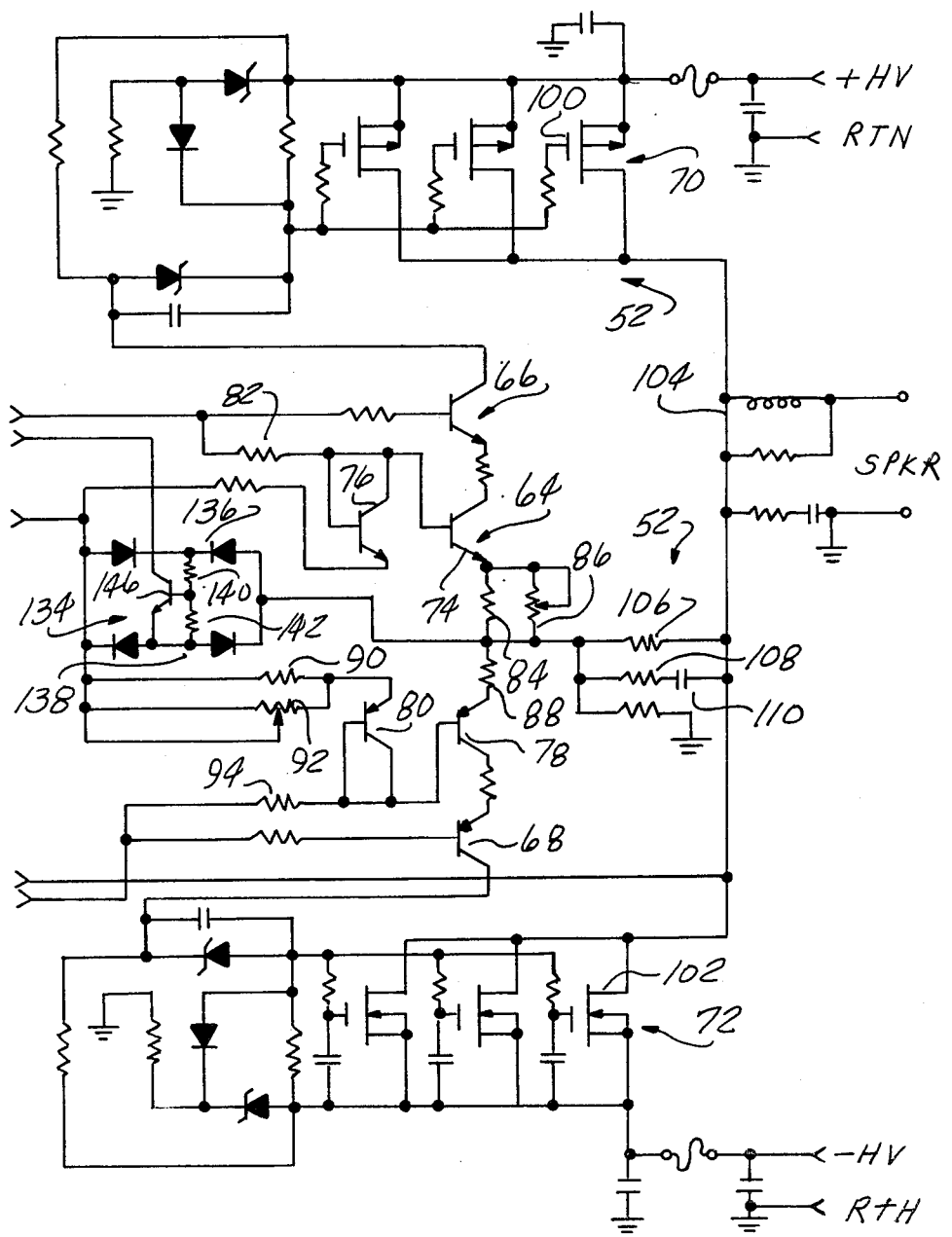

Referring briefly to FIG. 3, the outputs from the high voltage regulators 22 are applied to a pair of precision voltage regulators 28 which further regulate the input voltage. The outputs from the precision voltage regulators 28, labelled ± RV are supplied to the various electronic components used in the audio power amplifier of the present invention for biasing such components to the desired operating range.

Figure 2:
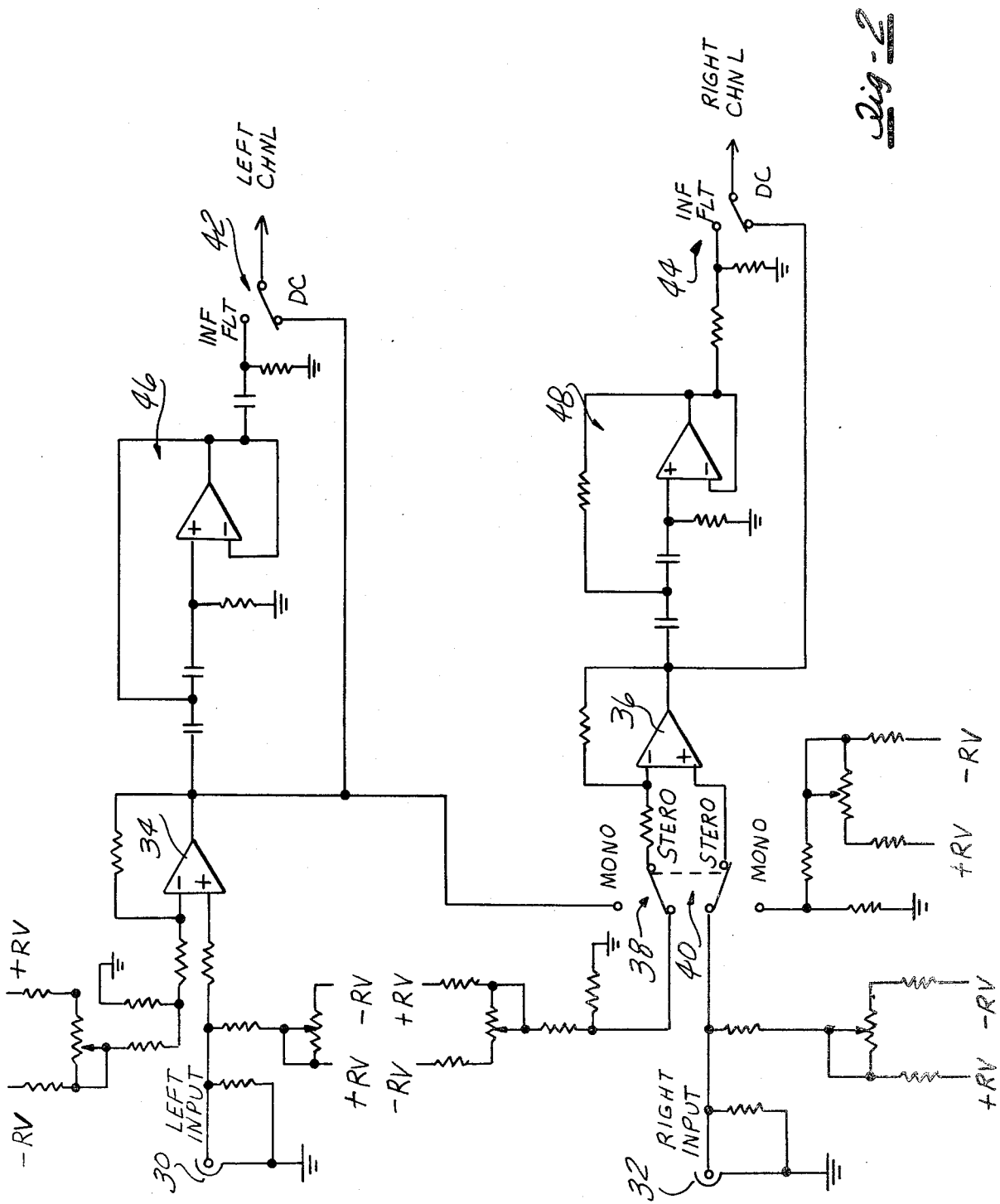
FIG. 2 is a circuit diagram of the mode select and infrasonic filter circuitry of the present audio power amplifier.

The mode select circuitry of the audio power amplifier of the present invention is illustrated in FIG. 2. This circuit includes a pair of input terminals 30 and 32, labelled, respectively, LEFT INPUT and RIGHT INPUT, which are adapted to be connected to a suitable source of audio frequency signals, such as the output of a preamplifier, tape unit or turntable. The audio signals received on inputs 30 and 32 are respectively input to a pair of suitably biased operational amplifiers 34 and 36.

A pair of ganged switches 38 and 40 are provided and are switchable between two positions, labelled STEREO and MONO. When stereophonic reproduction is desired and the switches 38 and 40 are positioned in the STEREO position, the input audio signals received at the left and right inputs 30 and 32 are input to the respective operational amplifiers 34 and 36. In the case of monophonic amplification, the ganged switches 38 and 40 are moved to the MONO position and a single audio input is connected to the LEFT INPUT 30. This single audio signal, after amplification by operational amplifier 34, is input through switch 38 to the operational amplifier 36 such that the same signal is present at the left and right channel outputs.

A second set ganged switches 42 and 44 is provided for directly coupling the output of the operational amplifiers 34 and 36 to the power amplification circuitry, illustrated in FIG. 3 and described hereafter, or to route the audio signal through infrasonic filters 46 and 48, respectively.

Each infrasonic filter 46 and 48 includes an amplifier which is provided with negative feedback. The filters 46 and 48 are preferably designed to provide 18 db per octave attentuation so as to eliminate or suppress low frequencies from the audio signal before it is input to the amplification circuitry described hereafter. Thus, by means of the switches 42 and 44, the infrasonic filters 46 and 48 may be selectively connected into the circuitry of the power amplifier of the present invention or bypassed.

Referring now to FIG. 3, there is illustrated the power amplification circuitry of the audio power amplifier of the present invention. It will be understood that the circuitry illustrated in FIG. 3 is utilized for one channel of the power audio amplifier of the present invention, with a second identical circuit utilized for the corresponding channel.

In general, the power amplification circuitry includes an input amplifying means shown generally by reference number 50 and an output power amplifying means denoted in general by reference number 52.

The input amplifying means 50 comprises an operational amplifier 52 which is provided with negative feedback from its output to its input and acts as a low voltage amplifier. One of the outputs from the mode select circuitry illustrated in FIG. 2 is connected to input 56 of the amplification circuitry which is in turn connected through resistor 58 and inductor 60 to the positive (+) input terminal of amplifier 54. The inverting (−) input terminal of the amplifier 54 is connected to suitable biasing circuitry, denoted in general by reference number 62, so as to place the amplifier 54 in a linear operating range.

The output of the input amplifying means 50 is connected to the output power amplifying means 52. In general, the output power amplifying means 52 comprises a biasing network, denoted in general by reference number 64, drivers 66 and 68 and output power amplifiers, denoted in general by reference numbers 70 and 72.

The biasing network includes transistors 74, 76, 78 and 80 and resistors 82, 84, 86, 88, 90, 92 and 94. The biasing network 64 is connected across the outputs of the precision voltage regulators 28 and is operative to provide the required idlying current to the field effect transistors utilized in the output power amplifying circuits 70 and 72, as described hereafter. Variable resistor 86 enables the desired amount of idlying current to be selected between the interconnected drain electrodes of the field effect transistors.

The output power amplifiers 70 and 72, respectively, comprise a p-channel field effect transistor, such as transistor 100, and a n-channel field effect transistor 102, each having gate, source and drain electrodes of the p-channel transistor 100 and the n-channel transistor 102 are interconnected as shown in FIG. 3. The interconnection point forms an output signal terminal 104.

In a preferred embodiment, three matched p-channel field effect transistors and three matched n-channel field effect transistors are connected in parallel with their complimentary types to provide a predetermined amount of power output for the audio power amplifier.

It will be understood, however, that any number of p-channel and n-channel field effect transistors may be utilized to provide any desired amount of power output.

Means for driving the p-channel and n-channel field effect transistors 100 and 102 in a transconductance mode of operation is provided and, in general includes driving transistors 66 and 68. In a transconductance mode of operation, the output current through the field effect transistors 100 and 102 to the output signal terminal 104 is directly proportional to the input voltage applied to the output power amplification means 52. This provides greater isolation between the output and input voltages of the output power amplification means and results in a wider range of audio frequency reproduction capability then previously possible utilizing other types of transistors and transistor amplification configurations.

An output power amplification means feedback loop comprising the parallel connected resistor 106 and serially connected resistor 108 and capacitor 110 are connected between the output of the power amplifying means 54 and the input thereof. Specifically, the feedback loop is connected between the output signal terminal 104 and the drivers 66 and 68. By means of this feedback path and precise matching of the operating characteristics of the p-channel and n-channel transistors, prestabilization of the output stage of the audio power amplifier of the present invention for gain and frequency characteristics is attained. In addition, matching of two or more feedback resistors previously used in transistor power amplifier circuits is eliminated as the feedback path utilized in the present invention provides a single loop for both positive and negative sides of the output stage of the audio power amplifier.

A first or main feedback for the audio power amplifier of the present invention is provided between the output of the power amplifying means 52 and the input of the amplifying means 50 and comprises serially connected resistors 112 and 114 and serially connected resistor 116 and capacitor 118. This feedback loop provides stabilization for the entire audio power amplifier of the present invention.

During overload conditions when the input signal of the audio power amplifier exceeds the range of the amplifier in reproducing such signal at its output, the output signal of the terminal 104 will be clipped, i.e., not track the input signal. When this occurs, feedback through the first feedback path is lost and the amplifier becomes unstable. When the magnitude of the input signal returns to a lower value, the output will begin to again track the input signal but with slight delay which causes distortion in the reproduced audio sound.

To reduce the amount of distortion when an overload occurs, a second feedback path, denoted in general by reference number 130, is connected between the output of the input amplifying means 50 and the input thereto. The second feedback path 130 generally comprises two series of diodes which are connected in reversed parallel configuration between the output and input of the operational amplifier 54. This feedback loop 130 forces the input amplifier 54 into a linear mode just prior to the output amplifier 52 re-entering linear operation from a clipped mode. In this manner, feedback remains in effect throughout an overload state which minimizes recovery of the amplifier from a clipped mode and thereby significantly reduces the amount of distortion in the reproduced sound.

A clip detect circuit, denoted in general by reference number 134, is provided to detect the occurrence of an overload, such as indicated by a clipped output from the audio power amplifier. The clip detect circuit 134 comprises two serially interconnected reversed diode pairs 136 and 138 which are connected to the output of the input amplifying means 50 and output of the power amplifying means 52. Resistors 140 and 142 are connected between the junctions between the diode pairs 136 and 138 and used to drive the base of transistor 146. Transistor 146 has its emitter connected to the base of transistor 148, FIG. 4, which is connected in a multivibrator circuit. The clip detect circuit 134 senses the differential voltage drop between the input amplifier 54 and the power amplifier 52 and triggers the multi-vibrator whenever a voltage or current overload is detected between the two amplifying means 50 and 52. When energized, the multi-vabrator 148 causes current to flow through an LED 150 which provides an indication of the occurrence of a clip or overload.

Finally, the audio power amplifier of the present invention includes a temperature monitor circuit 160 which is illustrated in FIG. 5. The temperature monitor circuit 160 includes a pair of temperature responsive resistive sensors shown symbolically by reference numbers 162 and 164, which are mounted in heat sinks, not shown, attached to the audio power amplifier. The output resistance of the sensors 162 and 164, as is well known, drops substantially when a threshold temperature, i.e., 180° C., is sensed. These signals are input to a comparator 116 which compares the signal with a preset valve and generates two output signals, labelled R MUTE and L MUTE, whenever the threshold over-temperature is reached. The R MUTE and L MUTE signals are each connected to a suitably biased junction FET 168, FIG. 3, which, when it becomes conductive, suppresses the input audio signal to the amplifier 54 and in effect de-energizes the amplification circuitry shown in FIG. 3. The MUTE signal will remain present until the amplifier has cooled down sufficiently to permit normal operation to resume.

The temperature monitor circuit 160 also includes an amplifier 170 which drives an LED to provide an indication of an over-temperature condition. Thus, there has been disclosed an audio power amplifier having an output stage incorporating power MOS-FET transistors connected for operation in a transconductance mode of operation. This output stage configuration uniquely enables a transistorized audio power amplifier to match the superior audio reproduction characteristics of previous amplifiers utilizing vacuum tubes.

What is claimed is:

1. An audio power amplifier comprising:
  input amplifying means having an input for receiving an audio frequency signal and an output;
  output power amplifying means including a p-channel field effect transistor and a n-channel affect transistor, each having gate, source and drain electrodes, the drain electrodes of the p-channel and n-channel field effect transistors being interconnected;
  an output signal terminal formed at the interconnection between the drain electrodes of the p-channel and n-channel field effect transistors;
  means for driving the p-channel and n-channel field effect transistors in a transconductance mode of operation wherein the output current through the field effect transistors is a direct function of the input voltage applied to the p-channel and n-channel field effect transistors; the driving means including:

means for providing first and second voltage sources, the first voltage source being applied to the source electrodes of the p-channel and n-channel field effect transistors;

first and second transistors connected to the output of the input amplifying means, the second voltage source being applied to the first and second transistors:

first and second drive transistors responsive to the output of the first and second transistors, respectively, for generating a current proportional to the voltage of the audio frequency input signal;

means for converting the current to a voltage and applying the voltage to the p-channel and n-channel field effect transistors to generate an output current through the p-channel and n-channel field effect transistors which is a direct function of the voltage applied thereto;

a first feedback path connected between the interconnected drain electrodes of the p-channel and n-channel field effect transistors and the input of the input amplifying means; and a second feedback path connected between the output and input terminals of the input amplifying means for biasing the input amplifying means into linear operation prior to the return of the output power amplifying means to linear operation after an overload of the output amplifying means the second feedback path including:

first and second diodes connected in reverse parallel configuration between the output and input of the input amplifying means;

a plurality of auxiliary diodes connected in series with each of the first and second diodes; and reverse bias reference voltages connected to the junctions between the first and second diodes and each auxiliary diode series;

the auxiliary diodes and the reverse bias reference voltages providing a reverse bias requiring an increased voltage across the first and second diodes before the first and second diodes will conduct.

* * * * *